United States Patent
Bian

(10) Patent No.: US 8,084,355 B2
(45) Date of Patent: *Dec. 27, 2011

(54) METHODS OF FORMING COPPER-COMPRISING CONDUCTIVE LINES IN THE FABRICATION OF INTEGRATED CIRCUITRY

(75) Inventor: Zailong Bian, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 12/762,780

(22) Filed: Apr. 19, 2010

(65) Prior Publication Data

US 2010/0248472 A1   Sep. 30, 2010

Related U.S. Application Data

(63) Continuation of application No. 12/409,902, filed on Mar. 24, 2009, now Pat. No. 7,723,227.

(51) Int. Cl.
*H01L 21/336* (2006.01)
*H01L 21/331* (2006.01)
*H01L 21/4763* (2006.01)

(52) U.S. Cl. . 438/623; 438/296; 438/359; 257/E21.575; 257/E21.579; 257/E21.581

(58) Field of Classification Search .................. 438/623, 438/296, 359, 222; 257/E21.575, E21.579, 257/E21.581

See application file for complete search history.

(56) References Cited

U.S. PATENT DOCUMENTS

| | | |
|---|---|---|
| 5,976,967 A | 11/1999 | Wu |
| 6,081,032 A | 6/2000 | Wu |
| 6,429,118 B1 | 8/2002 | Chen et al. |
| 6,472,721 B2 * | 10/2002 | Ma et al. ........................ 257/531 |
| 6,627,549 B2 | 9/2003 | Jengling |
| 6,709,563 B2 | 3/2004 | Nagai et al. |
| 6,764,940 B1 | 7/2004 | Rozbicki et al. |

(Continued)

FOREIGN PATENT DOCUMENTS

WO   WO/02/099873   12/2002

OTHER PUBLICATIONS

"Plasma-Enhanced Deposition from TEOS and Oxygen", www.timedomaincvd.com/CVD_Fundamentals/films/PECVD_TEOS.html, TimeDomain CVD Inc., Jan. 19, 2009, pp. 1-2.

(Continued)

*Primary Examiner* — Alexander Ghyka
*Assistant Examiner* — Seahvosh Nikmanesh
(74) *Attorney, Agent, or Firm* — Wells St. John P.S.

(57) ABSTRACT

A method of forming copper-comprising conductive lines in the fabrication of integrated circuitry includes depositing damascene material over a substrate. Line trenches are formed into the damascene material. Copper-comprising material is electrochemically deposited over the damascene material. The copper-comprising material is removed and the damascene material is exposed, and individual copper-comprising conductive lines are formed within individual of the line trenches. The damascene material is removed selectively relative to the conductive copper-comprising material. Dielectric material is deposited laterally between adjacent of the individual copper-comprising conductive lines. The deposited dielectric material is received against sidewalls of the individual copper-comprising conductive lines. A void is received laterally between immediately adjacent of the individual copper-comprising conductive lines within the deposited dielectric material. Other embodiments are contemplated.

38 Claims, 14 Drawing Sheets

U.S. PATENT DOCUMENTS

| | | |
|---|---|---|
| 6,787,912 B2 | 9/2004 | Lane et al. |
| 7,009,272 B2 | 3/2006 | Borger et al. |
| 7,022,602 B2 | 4/2006 | Ruelke et al. |
| 7,023,093 B2 | 4/2006 | Canaperi et al. |
| 7,279,377 B2 | 10/2007 | Rueger et al. |
| 7,309,649 B2 | 12/2007 | Colburn et al. |
| 7,470,613 B2 | 12/2008 | Agarwala et al. |
| 7,484,198 B2 | 1/2009 | Lin et al. |
| 7,498,233 B2 | 3/2009 | Kim et al. |
| 7,723,227 B1 * | 5/2010 | Bian .......................... 438/623 |
| 2004/0020110 A1 | 2/2004 | Van Voorthuizen |
| 2004/0106302 A1 | 6/2004 | Jang |
| 2006/0246721 A1 * | 11/2006 | Preusse et al. ................ 438/660 |
| 2007/0054485 A1 | 3/2007 | Torres et al. |

OTHER PUBLICATIONS

Pratt, "Overview of the Use of Copper Interconnects in the Semiconductor Industry", Advanced Energy, Nov. 2004, pp. 1-20.

* cited by examiner

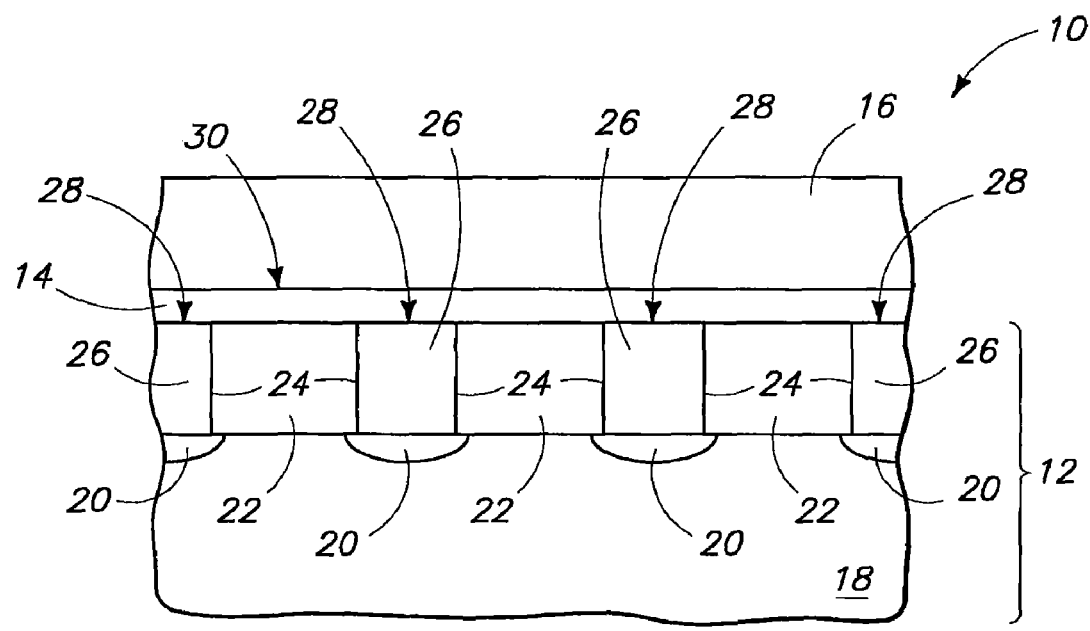
_FIG. 1_
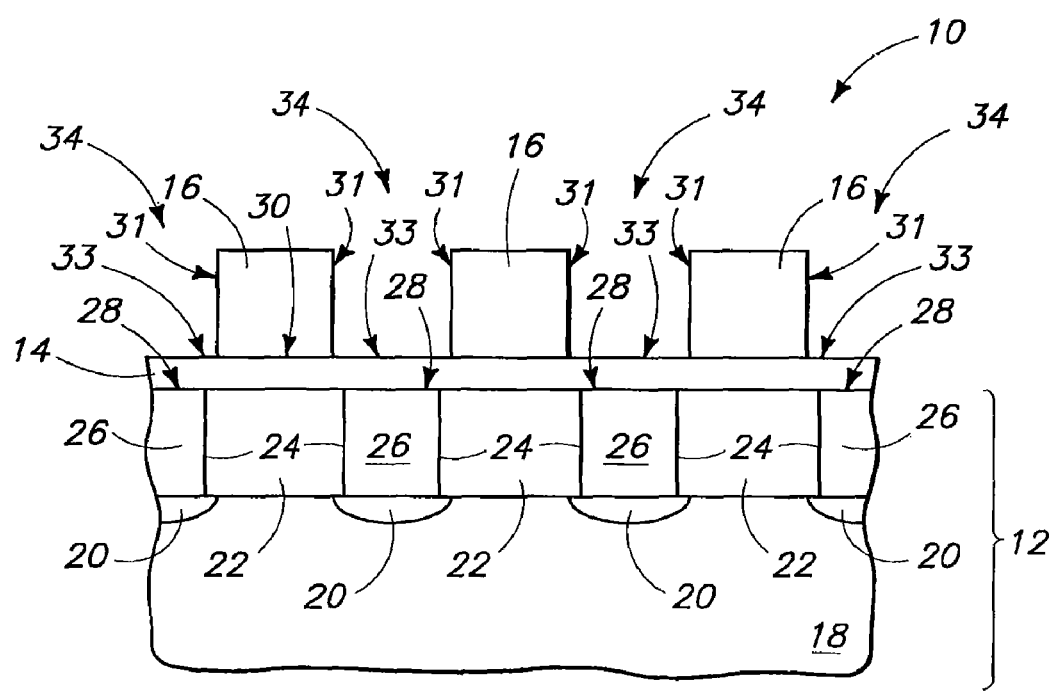
_FIG. 2_

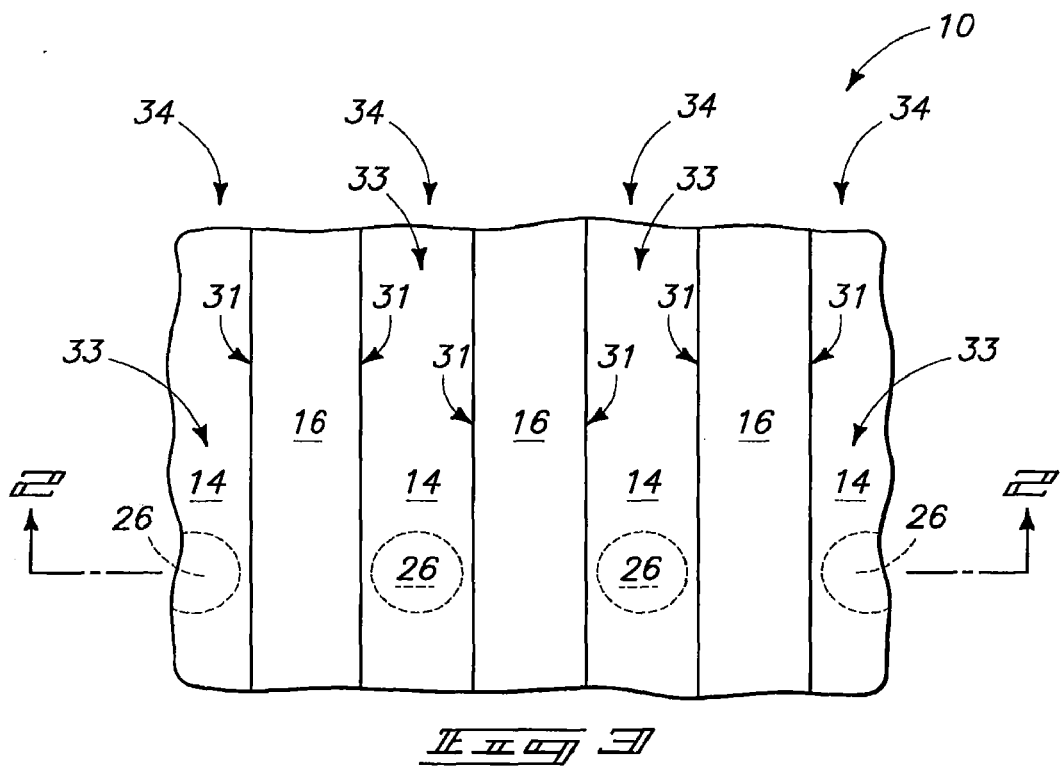
F I G 3
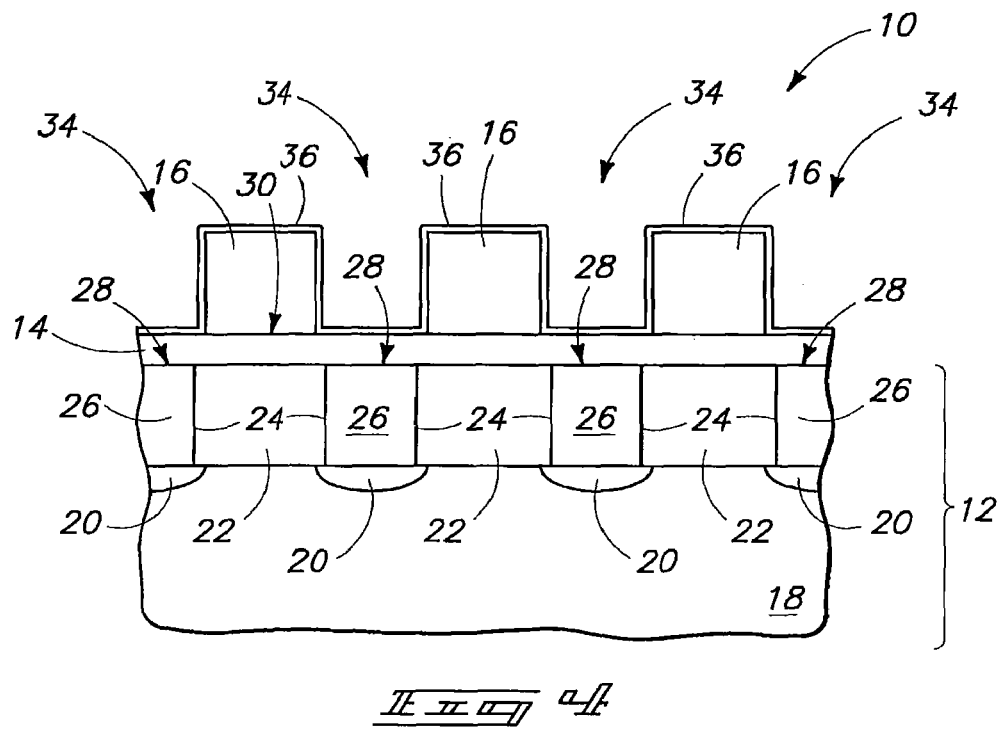
F I G 4

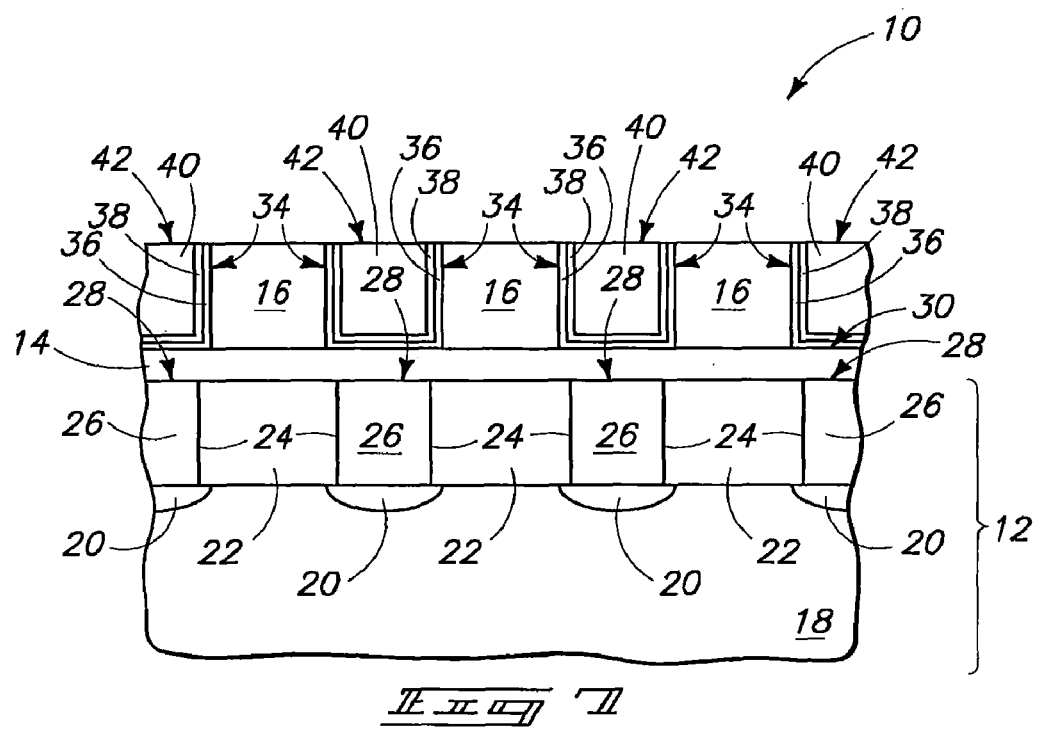
_FIG. 7_
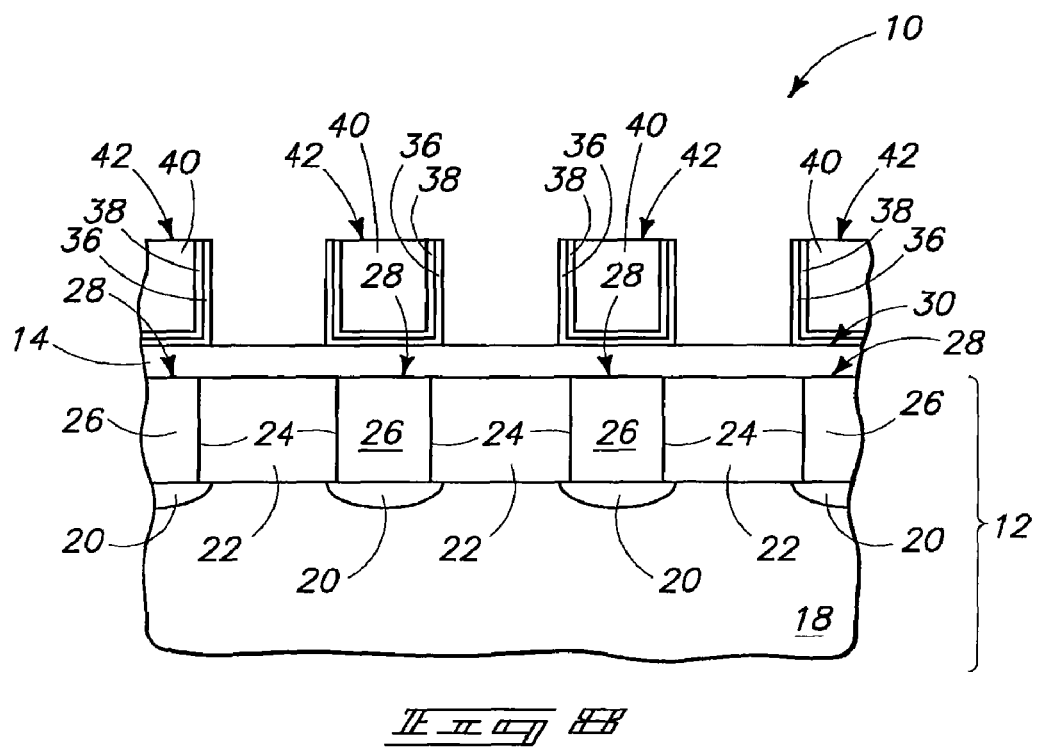
_FIG. 8_

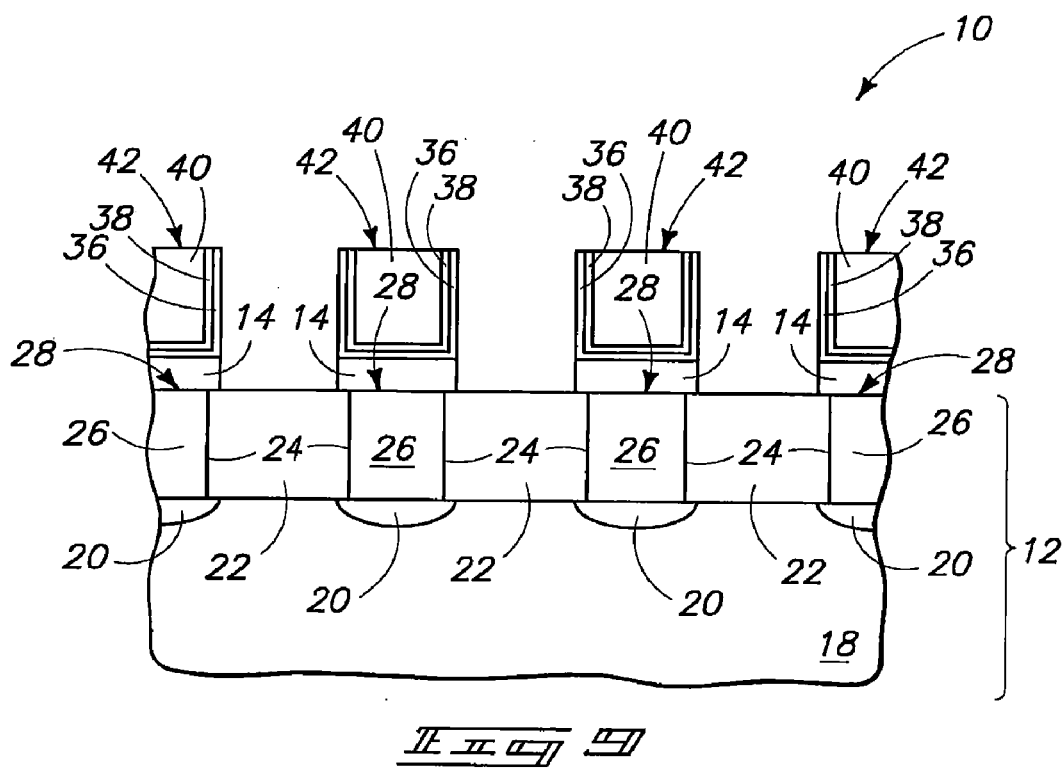
_FIG 9_
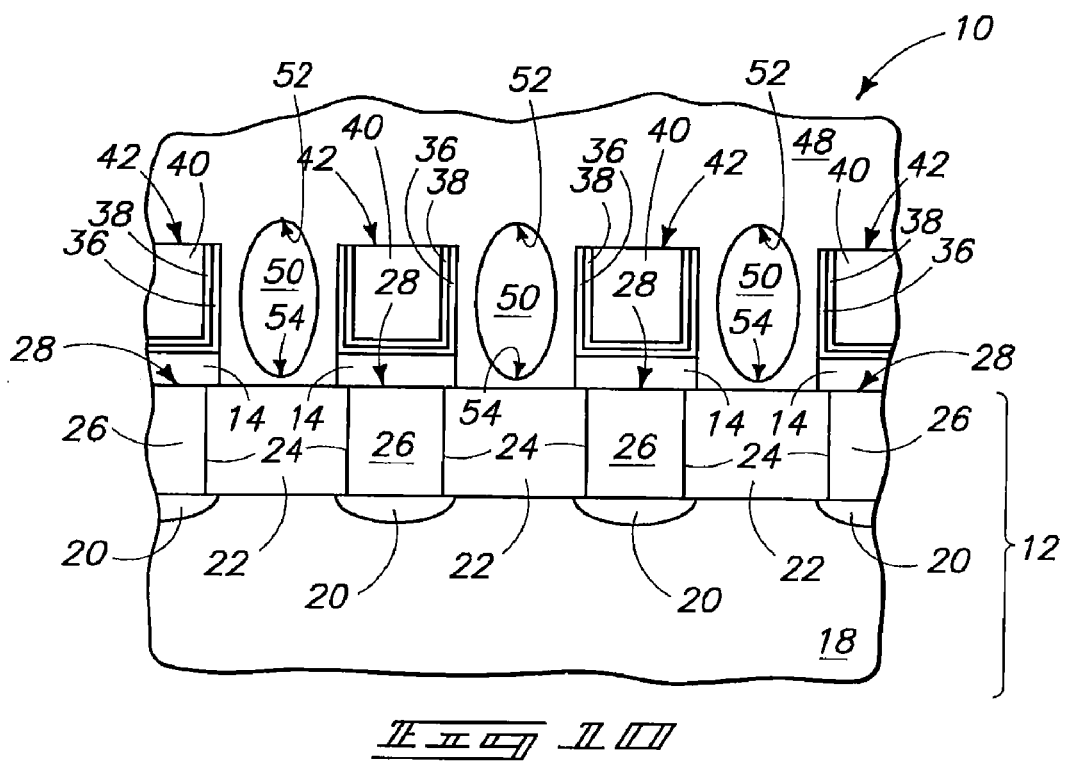
_FIG 10_

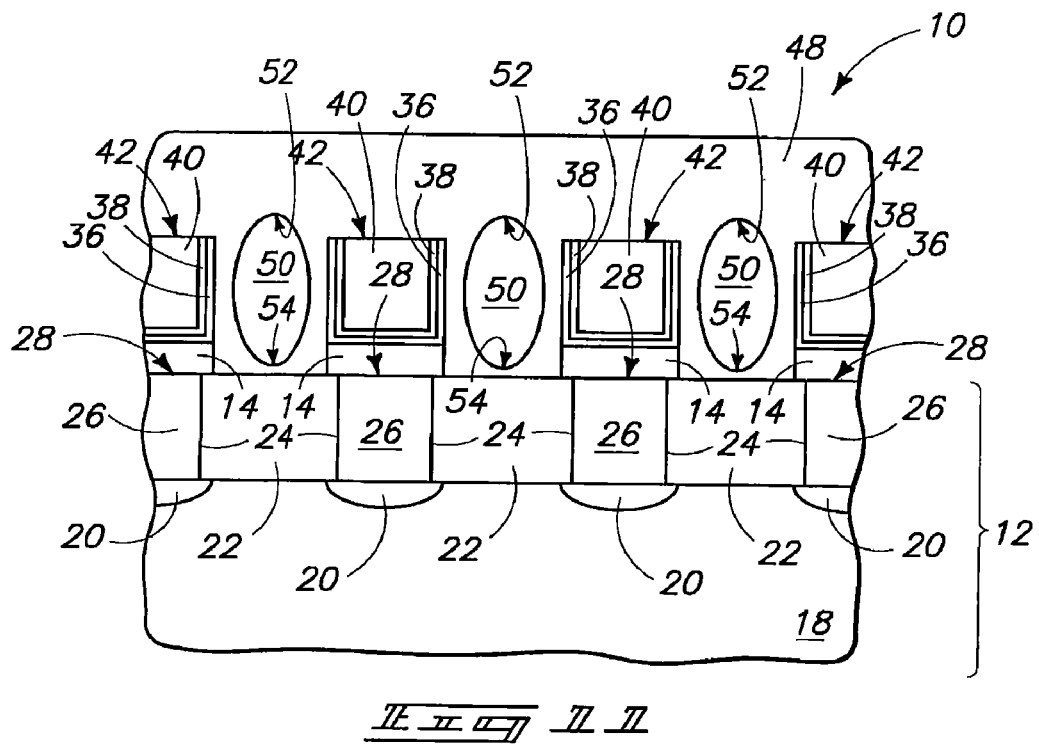
F I G. 11
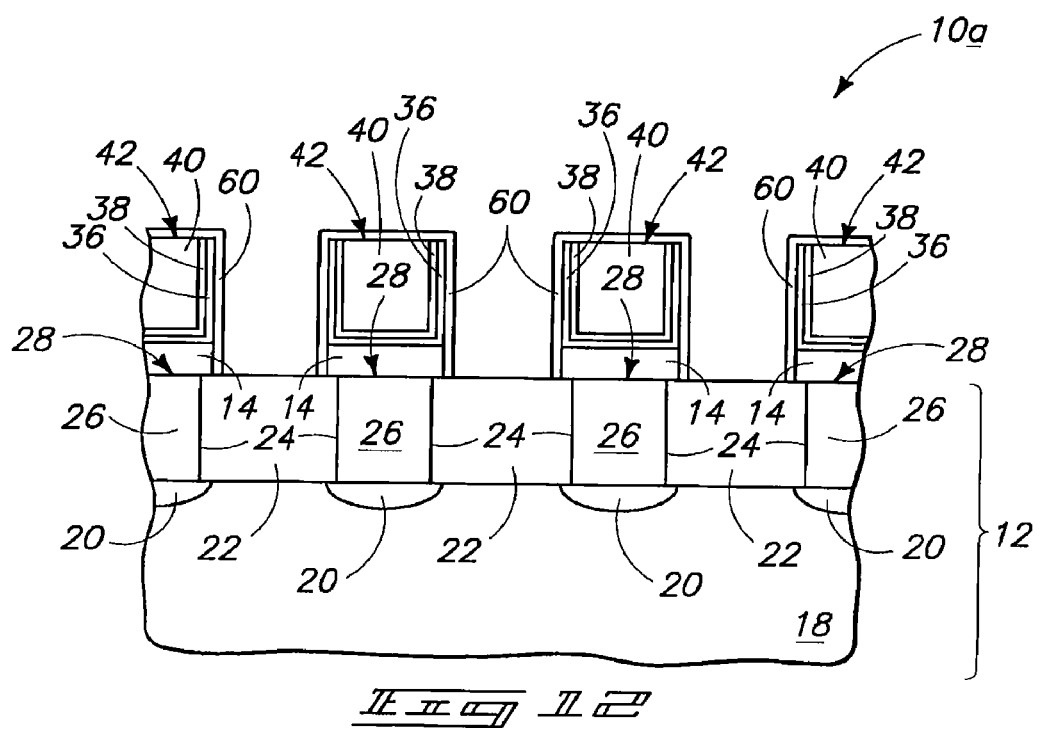
F I G. 12

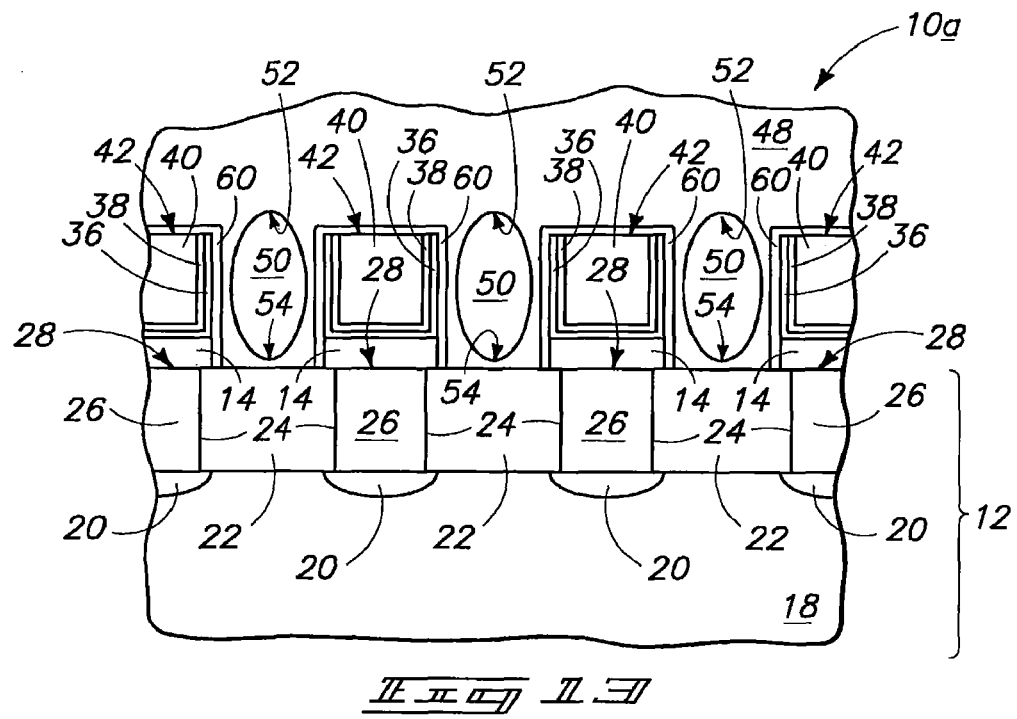
F I G. 13
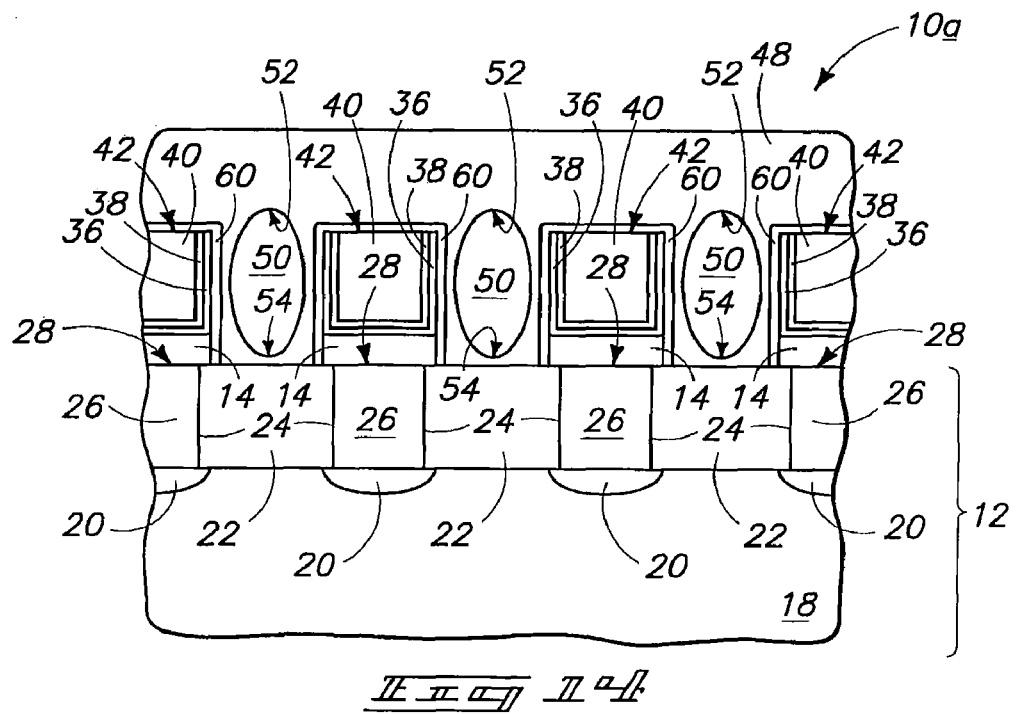
F I G. 14

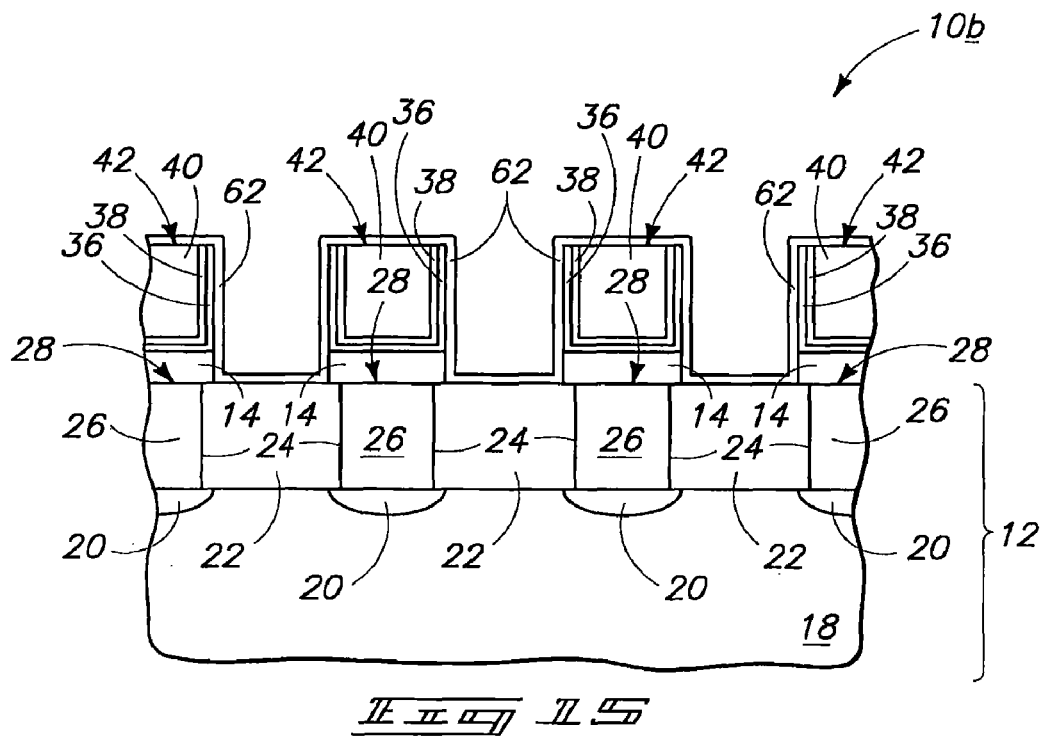
_FIG 15_
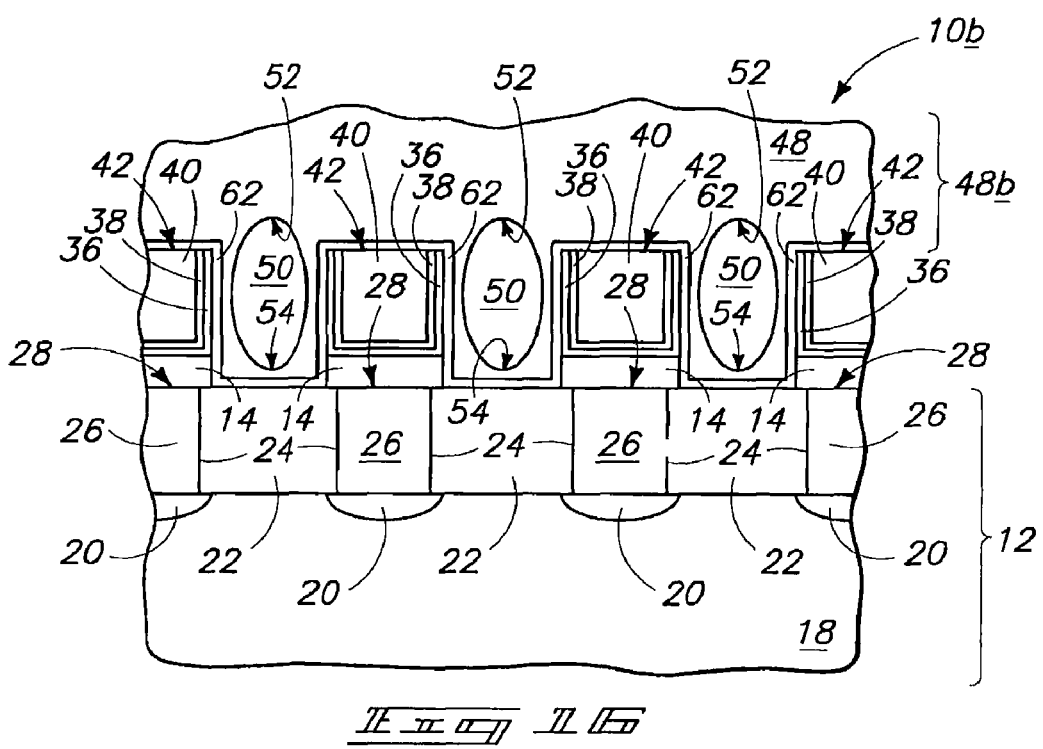
_FIG 16_

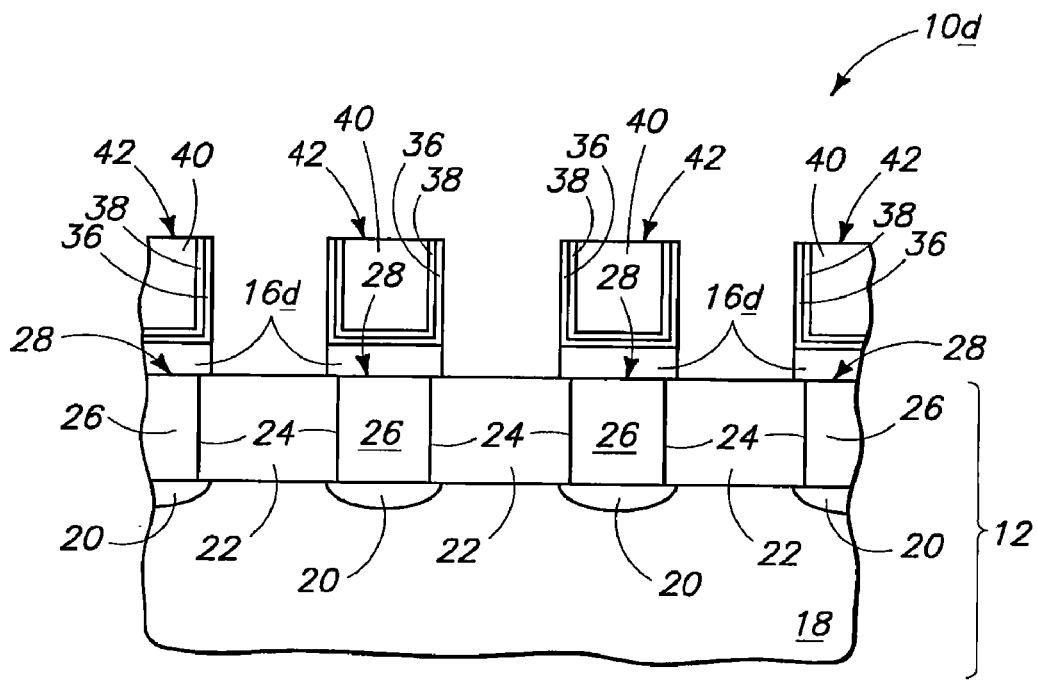
_FIG 23_
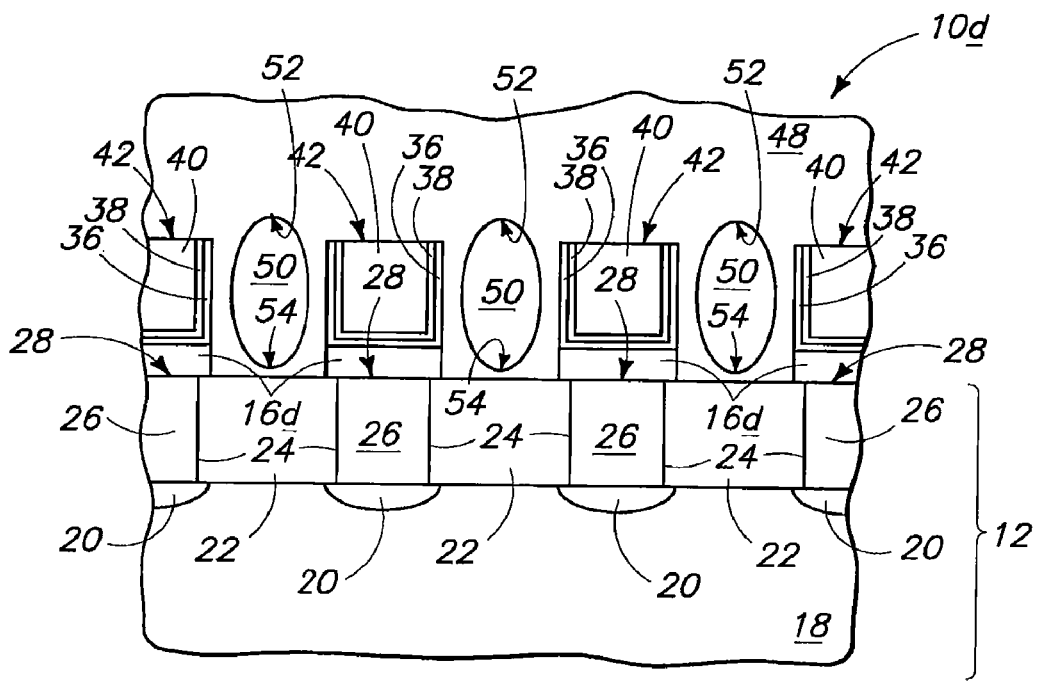
_FIG 24_

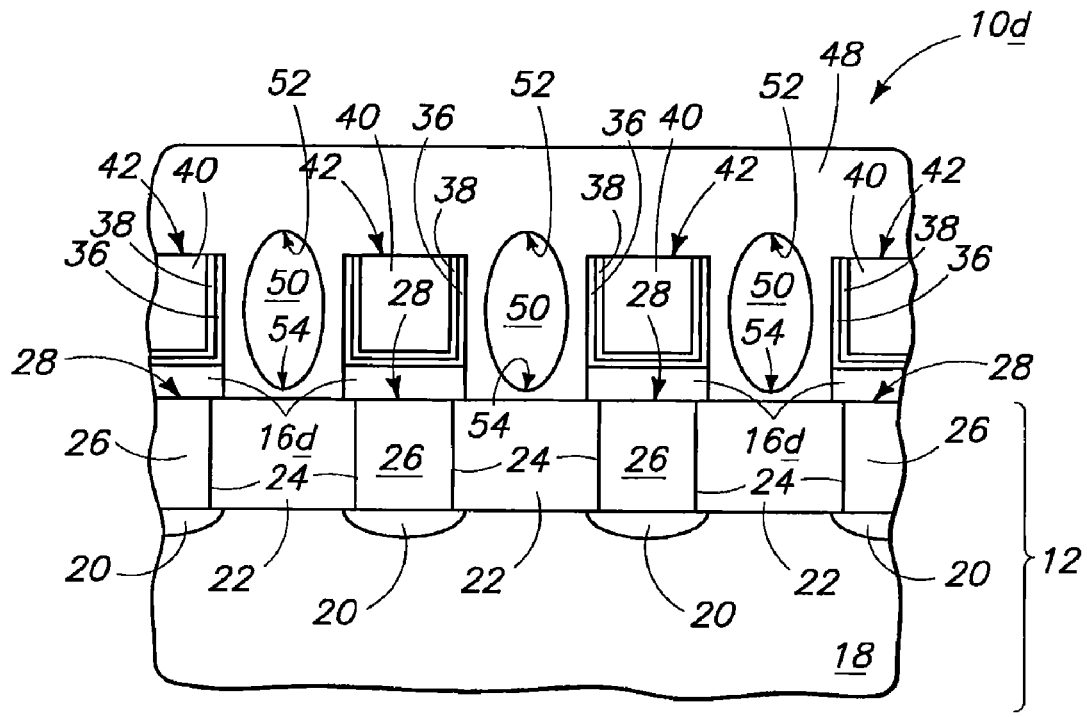
_FIG 25_
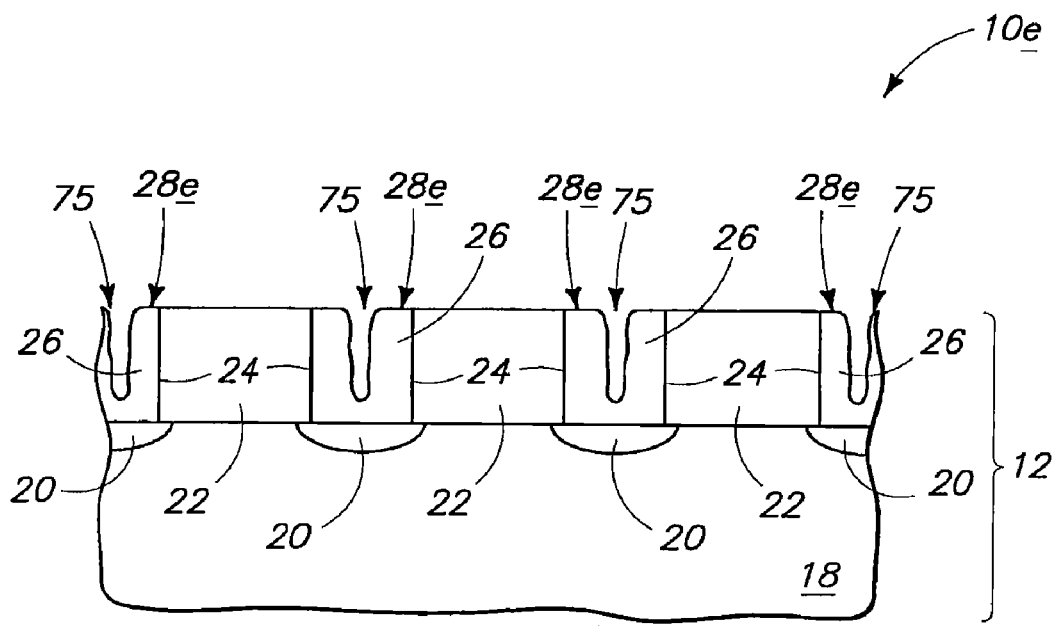
_FIG 26_

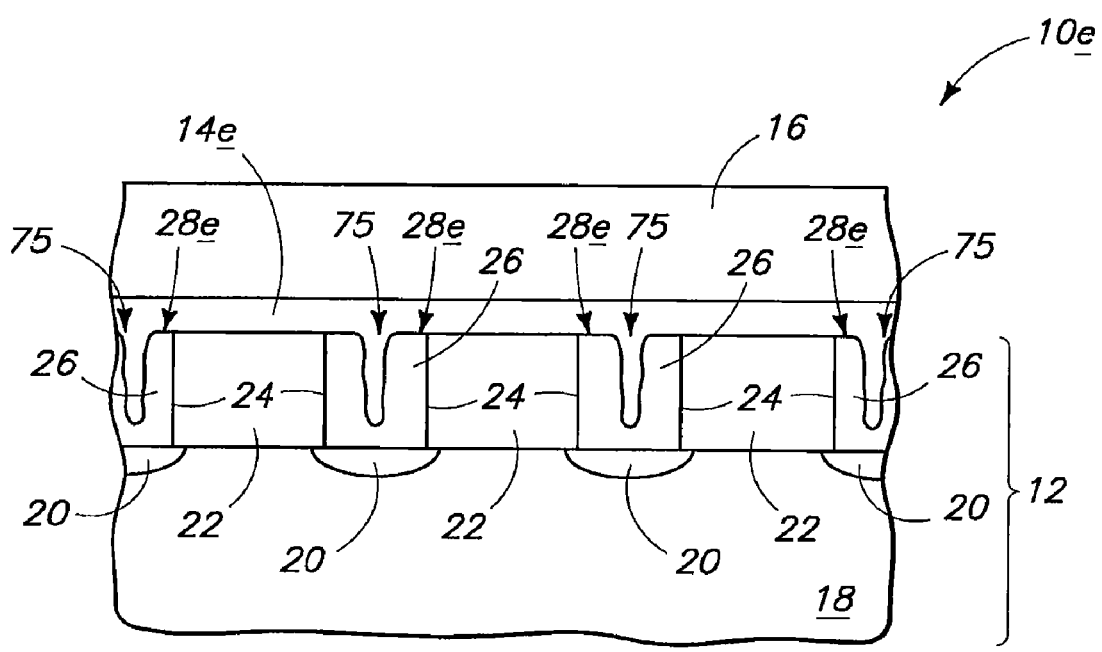

US 8,084,355 B2

METHODS OF FORMING COPPER-COMPRISING CONDUCTIVE LINES IN THE FABRICATION OF INTEGRATED CIRCUITRY

RELATED PATENT DATA

This patent resulted from a continuation application of U.S. patent application Ser. No. 12/409,902, filed Mar. 24, 2009, entitled "Methods Of Forming Copper-Comprising Conductive Lines In The Fabrication Of Integrated Circuitry", naming Zailong Bian as inventor, the disclosure of which is incorporated by reference.

TECHNICAL FIELD

Embodiments disclosed herein pertain to methods of forming copper-comprising conductive lines in the fabrication of integrated circuitry.

BACKGROUND

Conductive lines are used in integrated circuitry as electrical interconnects. Aluminum has historically been the dominant interconnect material, but is being replaced by copper in part due to its lower electrical resistance and higher electromigration resistance. Using a lower resistivity interconnect material like copper decreases the interconnect RC delay, which increases the speed of the circuit.

The copper-comprising material of conductive lines may be deposited by a number of methods, for example, chemical vapor deposition, atomic layer deposition, physical vapor deposition, and electrochemical deposition. Electrochemical deposition is becoming the most popular method due its low costs and superior fill capability. A plurality of integrated circuits is typically fabricated relative to a single semiconductor substrate/wafer at the same time, with the substrate subsequently being cut into individual chips or die. It is of course desirable that the various layers which are deposited across the substrate be of uniform thickness independent of location on the substrate.

In electrochemical deposition, a substrate having a conductive surface is immersed in a solution containing metal ions. The conductive surface is electrically connected to a power supply that passes current through the surface and to the solution. The metal ions within the solution will be deposited as metal onto the conductive surface. Accordingly, deposition of the desired material occurs selectively relative to conductive outermost surfaces of the substrate to which a voltage potential is applied. Typically, the electrical connection to the conductive material outer surface to produce the voltage potential is made at the edge of the substrate. Such can result in a voltage drop from the edge of the substrate to its center due to resistance in the conductive material being deposited upon. If sufficiently great, the voltage drop adversely impacts current density from the edge of the substrate to the center of the substrate, and produces thinner or no deposited film thickness at the center compared to the edge of the substrate. This is commonly referred to as "terminal effect", which undesirably may result in thickness of the finished layer varying from the center of the substrate to the edge of the substrate. As device feature size continues to scale down, the conductive barrier and seed layers reduce in thickness. This leads to high resistance that may cause severe terminal effect.

There are a number of hardware and process approaches that may be used to reduce or diminish the terminal effect. Such include increasing the resistivity of the electrochemical bath, insertion of a highly resistive membrane adjacent to the wafer surface, and use of concentrically placed multiple or segmented anodes with different voltages being applied thereto. Additionally or alternately, insulating shielding might be provided in the bath around the edge of the wafer, and additional cathodes might be used to divert current from the edge of the wafer.

Regardless, in the finished integrated circuit construction, conductive interconnecting lines are spaced and separated from one another by dielectric material. Such inherently results in undesired parasitic capacitance which may be reduced by using low dielectric constant (low-k) material to reduce undesired parasitic capacitance.

While the invention was motivated in addressing the above-identified issues, the invention is in no way so limited.

BRIEF DESCRIPTION OF THE DRAWINGS

FIG. 1 is a diagrammatic sectional view of a fragment of a substrate in process in accordance with an embodiment of the invention.

FIG. 2 is a view of the FIG. 1 substrate at a processing step subsequent to that shown by FIG. 1, and taken through line 2-2 in FIG. 3.

FIG. 3 is a diagrammatic top view of the FIG. 2 substrate.

FIG. 4 is a view of the FIG. 2 substrate at a processing step subsequent to that shown by FIG. 2.

FIG. 7 is a view of the FIG. 6 substrate at a processing step subsequent to that shown by FIG. 6.

FIG. 8 is a view of the FIG. 7 substrate at a processing step subsequent to that shown by FIG. 7.

FIG. 9 is a view of the FIG. 8 substrate at a processing step subsequent to that shown by FIG. 8.

FIG. 10 is a view of the FIG. 9 substrate at a processing step subsequent to that shown by FIG. 9.

FIG. 11 is a view of the FIG. 10 substrate at a processing step subsequent to that shown by FIG. 10.

FIG. 12 is a diagrammatic sectional view of a fragment of a substrate in process in accordance with an embodiment of the invention.

FIG. 13 is a view of the FIG. 12 substrate at a processing step subsequent to that shown by FIG. 12.

FIG. 14 is a view of the FIG. 13 substrate at a processing step subsequent to that shown by FIG. 13.

FIG. 15 is a diagrammatic sectional view of a fragment of a substrate in process in accordance with an embodiment of the invention.

FIG. 16 is a view of the FIG. 15 substrate at a processing step subsequent to that shown by FIG. 15.

FIG. 23 is a view of the FIG. 22 substrate at a processing step subsequent to that shown by FIG. 22.

FIG. 24 is a view of the FIG. 23 substrate at a processing step subsequent to that shown by FIG. 23.

FIG. 25 is a view of the FIG. 24 substrate at a processing step subsequent to that shown by FIG. 24.

FIG. 26 is a diagrammatic sectional view of a fragment of a substrate in process in accordance with an embodiment of the invention.

FIG. 27 is a view of the FIG. 26 substrate at a processing step subsequent to that shown by FIG. 26.

DETAILED DESCRIPTION OF EXAMPLE EMBODIMENTS

Figure 5:
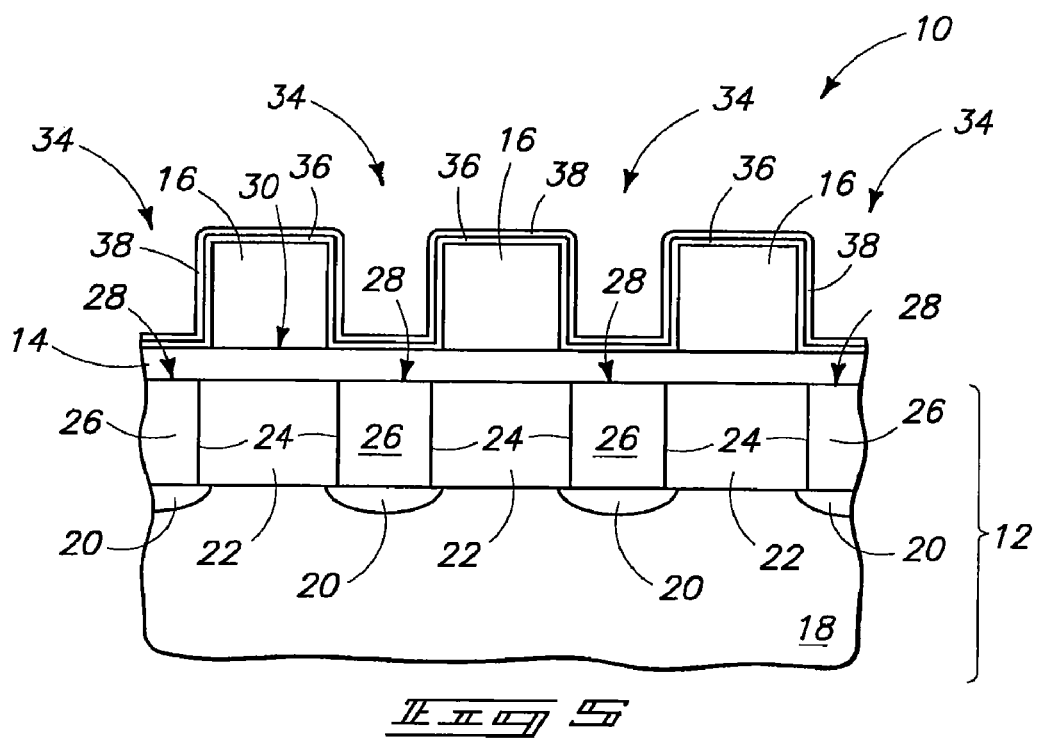
FIG. 5 is a view of the FIG. 4 substrate at a processing step subsequent to that shown by FIG. 4.

Example embodiment methods of forming copper-comprising conductive lines in the fabrication of integrated circuitry are initially described with reference to FIGS. 1-11. Referring to FIG. 1, a substrate fragment, for example, a semiconductor substrate, is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate fragment 10 is depicted as comprising a substrate 12 over which materials 14 and 16 have been deposited. Example substrate 12 comprises semiconductor material 18 (for example monocrystalline silicon) having conductively doped diffusion regions 20 formed therein. Dielectric material 22 has been deposited over material 18, and openings 24 have been formed there-through to diffusion regions 20. Conductive material 26 has been provided within openings 24, thereby forming conductive vias 28. Alternate substrates 12 may of course be used.

In one embodiment, conductor material 14 has been deposited over dielectric material 22 of substrate 12. An example thickness range for conductor material 14 is from 50 Angstroms to 1,000 Angstroms, and in one embodiment from 100 Angstroms to 300 Angstroms. Conductor material 14 may or may not be homogenous, with example materials including one or a combination of TiN, WN, Ti, W, and Al. In one embodiment, conductor material 14 has a planar outermost surface 30 entirely across the substrate. Such a surface may enhance conductivity across the substrate during electrochemical deposition where conductive contact is made to such surface at a radial location closer to the edge of the substrate than to the center of the substrate.

Damascene material 16 has been deposited over conductor material 14. In the context of this document, a "damascene material" is any material whether existing or yet-to-be developed which is used to make conductive interconnect lines in damascene-like manners. Such encompass forming trenches partially or fully through the material in the shape of desired circuitry interconnecting lines. Conductive material is subsequently deposited into the line trenches, followed by optional removal of excess conductive material and of some or all of the damascene material. Damascene material 16 may be homogenous or non-homogenous. Regardless, damascene material 16 may be any of insulative, semiconductive, or conductive, including any combinations thereof. Example insulating compositions for damascene material 16 include silicon dioxide and silicon nitride, and whether doped or undoped. Example semiconductive materials include semiconductively doped monocrystalline silicon and polycrystalline silicon. Example conductive materials include conductively doped semiconductive materials, conductive elemental metals, conductive metal compounds, and alloys of conductive elemental metals. Damascene material 16 may be of any suitable thickness, with from 100 Angstroms to 1 micron being an example range.

Referring to FIGS. 2 and 3, line trenches 34 have been formed into damascene material 16. In one embodiment and as shown, line trenches 34 extend completely through damascene material 16 and to conductor material 14. Alternately, line trenches 34 may not extend completely through damascene material 16 regardless of presence of conductor material 14 (i.e., if damascene material 16 is conductive). Any existing or yet-to-be developed technique for forming line trenches 34 may be used, with photolithography and subsequent subtractive etching being an example. Individual line trenches 34 may be considered as comprising opposing sidewalls 31 and a base 33. In one embodiment and as shown, base 33 comprises material 14.

Referring to FIG. 4, conductive barrier material 36 has been deposited over damascene material 16 and to within line trenches 34 to less than fill such line trenches, and to be in direct physical touching and electrical contact with conductor material 14. Such may be deposited by any of chemical vapor deposition, physical vapor deposition, or atomic layer deposition, as examples. An example thickness range for material 36 is from 20 Angstroms to 500 Angstroms. Example materials include TiN, TaN, WN, Ta, and Ti. Multiple of such or other materials may be used.

Referring to FIG. 5, a conductive seed material 38 has been deposited over conductive barrier material 36 to facilitate copper electrochemical deposition. An example thickness range is from 10 Angstroms to 500 Angstroms. Example materials include copper and ruthenium. Other materials may of course be used, including combinations of suitable conductive seed materials whether existing or yet-to-be developed. Regardless, one or both of conductive barrier material 36 and conductive seed material 38 may or may not be used.

Figure 6:
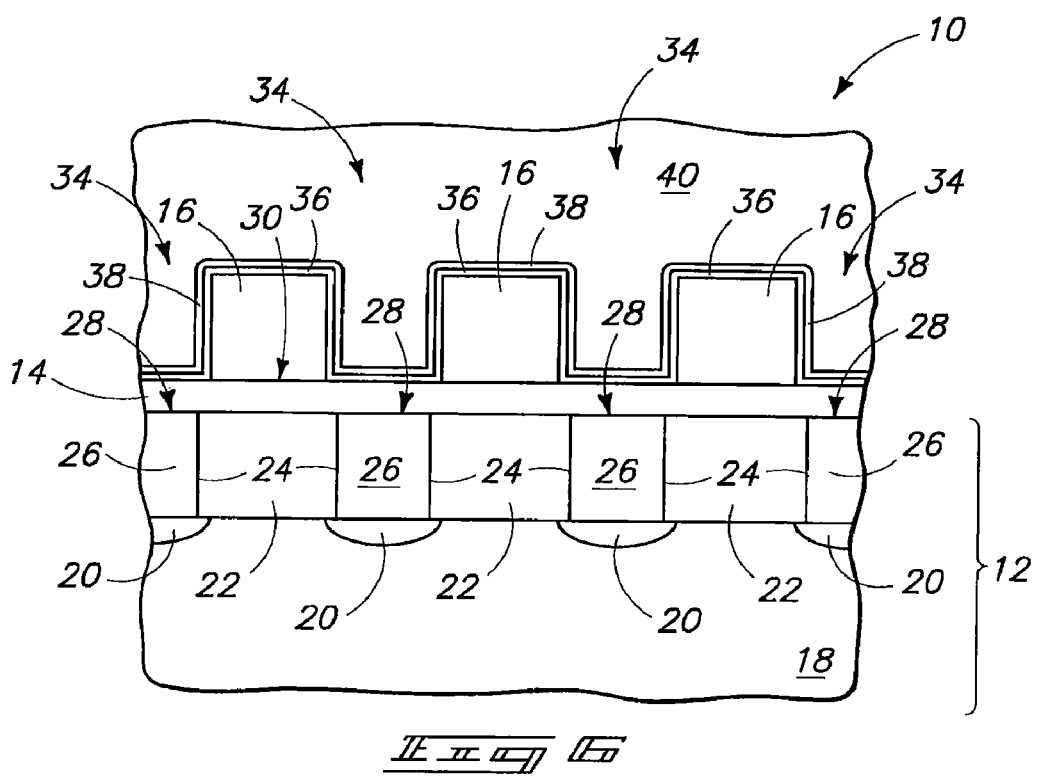
FIG. 6 is a view of the FIG. 5 substrate at a processing step subsequent to that shown by FIG. 5.

Referring to FIG. 6, conductive copper-comprising material 40 has been electrochemically deposited over damascene material 16 and to within line trenches 34. An example copper-comprising material is elemental copper electrochemically deposited by any existing or yet-to-be developed technique. Presence of conductor material 14 may reduce voltage drop and facilitate uniform current density distribution across the substrate, thereby aiding an electrochemical deposition of the copper-comprising material 40 uniformly across the substrate. Where one or both of materials 36 and 38 are present, conductor material 14 may form a parallel circuit conducting path with respect to materials 36 and/or 38 which may reduce resistance and thereby terminal effect.

Referring to FIG. 7, conductive copper-comprising material 40 above the trenches has been removed and damascene material 16 has been outwardly exposed. Accordingly, conductive seed material 38 and conductive barrier material 36, if present, have also been removed effective to expose damascene material 16. Individual copper-comprising conductive lines 42 have been formed within individual of line trenches 34. In the FIG. 7 embodiment, individual copper-comprising conductive lines 42 comprise conductive copper-comprising material 40, conductive seed material 38, and conductive barrier material 36 which is itself in electrical contact with conductor material 14. Conductor material 14 extends laterally between and electrically interconnects/shorts adjacent of individual copper-comprising conductive lines 42 in FIG. 7. Copper-comprising material 40 may be removed to produce the construction of FIG. 7 by any existing or yet-to-be developed methods. Examples include etch-back, chemical polishing, mechanical polishing, and chemical mechanical polishing.

Referring to FIG. 8, damascene material 16 (not shown) has been removed selectively relative to conductive barrier material 36, conductive copper-comprising material 40, and conductor material 14. In the context of this document, a selective removal or deposition requires removal or deposition of one material at a rate of at least 2:1 relative to the one or more other stated materials. Ideally, selective removals or depositions are at much higher ratios than 2:1, for example at 10:1. The artisan is capable of selecting any suitable existing or yet-to-be developed wet or dry etching chemistry to achieve the example FIG. 8 construction. For example, to etch any of $SiO_2$, $Si_3N_4$, or silicon materials selective to copper and other metals, such a process may use a $CF_4$-based chemistry, and achieve selectivity of greater than 5:1. Removing of the damascene material may be conducted to remove only some (not shown in FIG. 8) of the deposited damascene material from the substrate, or may be conducted to remove all of the damascene material (as shown in FIG. 8).

Referring to FIG. 9, conductor material 14 has been removed from extending laterally between and electrically interconnecting adjacent of individual copper-comprising conductive lines 42. Such may be conducted by any suitable substantially anisotropic dry etch method depending upon materials used. Wet etching might alternately be used if undercut of conductor material 14 from beneath conductive lines 42 can be minimized. FIG. 9 depicts one embodiment wherein conductor material 14 will remain elevationally received between individual copper-comprising conductive lines 42 and substrate 12 in a finished circuitry construction. FIG. 9 also depicts an example embodiment wherein individual copper-comprising conductive lines 42 overlie and are in electrical connection with respective conductive vias 28.

Referring to FIG. 10, dielectric material 48 has been deposited laterally between adjacent of individual copper-comprising conductive lines 42, and elevationally thereover. Deposited dielectric material 48 may or may not be homogenous. In one embodiment, deposited dielectric material 48 is received against sidewalls of the individual copper-comprising conductive lines 42 in a finished integrated circuitry construction, and a void 50 is received laterally between immediately adjacent of individual copper-comprising conductive lines 42 within deposited dielectric material 48 in the finished integrated circuitry construction. Provision of voids 50 between adjacent conductive copper-comprising lines 42 may provide effective decreased dielectric constant k, and thereby reduced parasitic capacitance between adjacent copper-comprising conductive lines. In one embodiment, voids 50 have a respective uppermost terminus 52 which is received elevationally outward of respective uppermost surfaces of conductive copper-comprising material 40 of immediately adjacent of individual copper-comprising conductive lines 42. In one embodiment, voids 50 have a respective innermost terminus 54 which is received elevationally inward of respective innermost surfaces of conductive copper-comprising material 40 of immediately adjacent of individual copper-comprising conductive lines 42.

In one embodiment, and as shown in FIG. 10, only a single void 50 in deposited dielectric material 48 is received laterally between immediately adjacent of individual copper-comprising conductive lines 42 in the finished circuitry construction. Regardless, ideally the void is formed during the act of depositing dielectric material 48, although such may be formed thereafter. For example, void formation may result in a plasma enhanced chemical deposition process of a silicon dioxide material using tetraethylorthosilicate (TEOS), and $O_2$ as deposition precursors. Void formation can be promoted in such a deposition by maximizing deposition rate, maximizing precursor flow rates, using single frequency processors, maximizing temperature, and reducing pressure. Voids can be promoted by intentionally degrading the step coverage of the deposition process. Typically, this can be done by running the process in mass transfer controlled regime, in which reactant flux reaching the surface of the structure controls deposition rate. By creating a flux gradient from the top to bottom, faster growth on top of the opening will be achieved and effectively form a void when pinched off. Regardless, in one embodiment, void 50 is equally spaced laterally between immediately adjacent of individual copper-comprising conductive lines 42.

Referring to FIG. 11, deposited dielectric material 48 has been planarized.

An alternate embodiment is shown and described with respect to a substrate fragment 10a in FIGS. 12-14. Like numerals from the first-described embodiment have been utilized where appropriate, with construction differences being indicated with the suffix "a" or with different numerals. FIG. 12 depicts additional processing after FIG. 9 and before FIG. 10. Specifically, conductive barrier material 60 has been selectively deposited over individual copper-comprising conductive lines 42 prior to deposition of the dielectric material 48 (not shown in FIG. 12). Conductive barrier material 60 does not bridge between adjacent of individual copper-comprising conductive lines 42. Example conductive barrier materials 60 include any of those described above for layer 36, including combinations thereof. Such may be deposited selectively to conductive materials relative to $SiO_2$ and/or $Si_3N_4$ by electroless deposition processes. Another example conductive barrier material 60 is cobalt tungsten phosphorus (CoWP), which may be deposited selectively to copper relative to $SiO_2$ and/or $Si_3N_4$ by electroless deposition processes.

FIGS. 13 and 14 depict subsequent processing from that of FIG. 12 corresponding in sequence to FIGS. 10 and 11, respectively, of the first-described embodiment.

Another example embodiment method in fabricating a substrate fragment 10b is next described with reference to FIGS. 15-17. Like numerals from the first-described embodiment have been utilized where appropriate, with construction differences being indicated with the suffix "b" or with different numerals. FIG. 15 depicts alternate processing to that shown by FIG. 12 of the above-described substrate 10a embodiment. In FIG. 15, a dielectric material 62 has been deposited, for example to function as a barrier to copper diffusion. Example materials include silicon nitride, silicon carbon nitride and silicon carbide. An example thickness for material 62 is from 50 Angstroms to 500 Angstroms.

Referring to FIG. 16, dielectric material 48 has been deposited having voids 50 formed therein, for example as described above. Accordingly, deposited dielectric materials 62 and 48 constitute an example deposited material 48b which is not homogenous.

Figure 17:
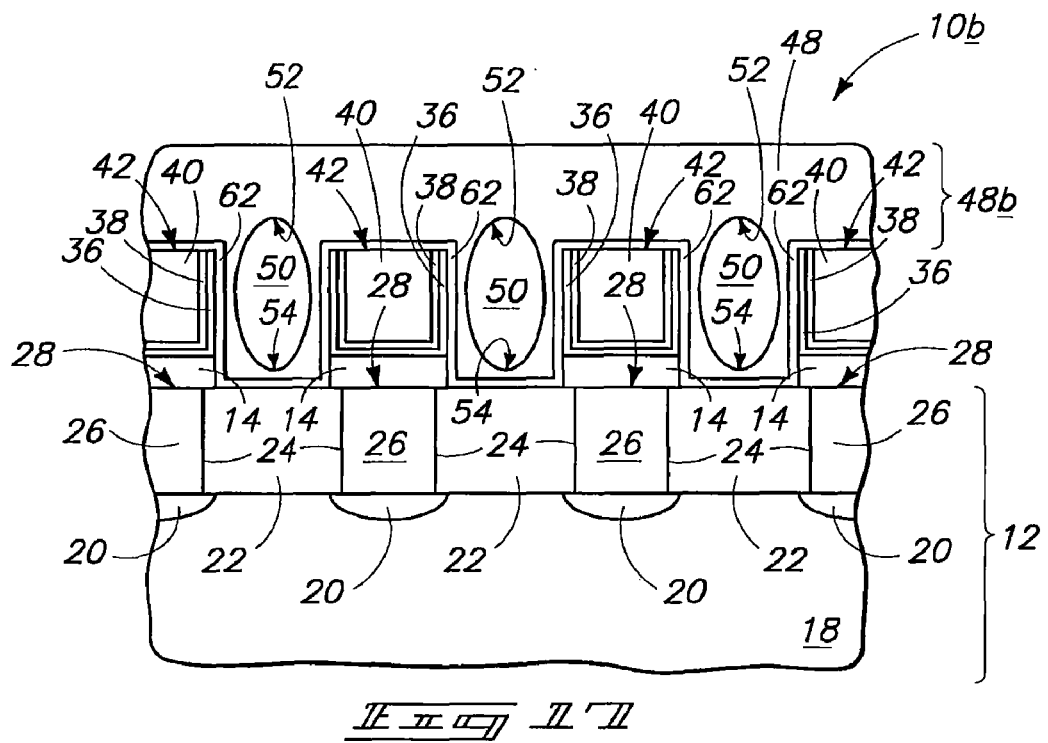
FIG. 17 is a view of the FIG. 16 substrate at a processing step subsequent to that shown by FIG. 16.

FIG. 17 depicts subsequent planarization of deposited dielectric 48b.

Embodiments of the invention ideally encompass provision of both a conductor material elevationally between the damascene material and the substrate and a void received laterally between immediately adjacent of the individual copper-comprising conductive lines within deposited dielectric material in the finished integrated circuitry construction.

However, both are not required in each embodiment. Provision of the conductor material between the damascene material and substrate may facilitate fabrication of the circuitry, wherein formation of the example voids may improve operation of the finished integrated circuitry.

Figure 18:
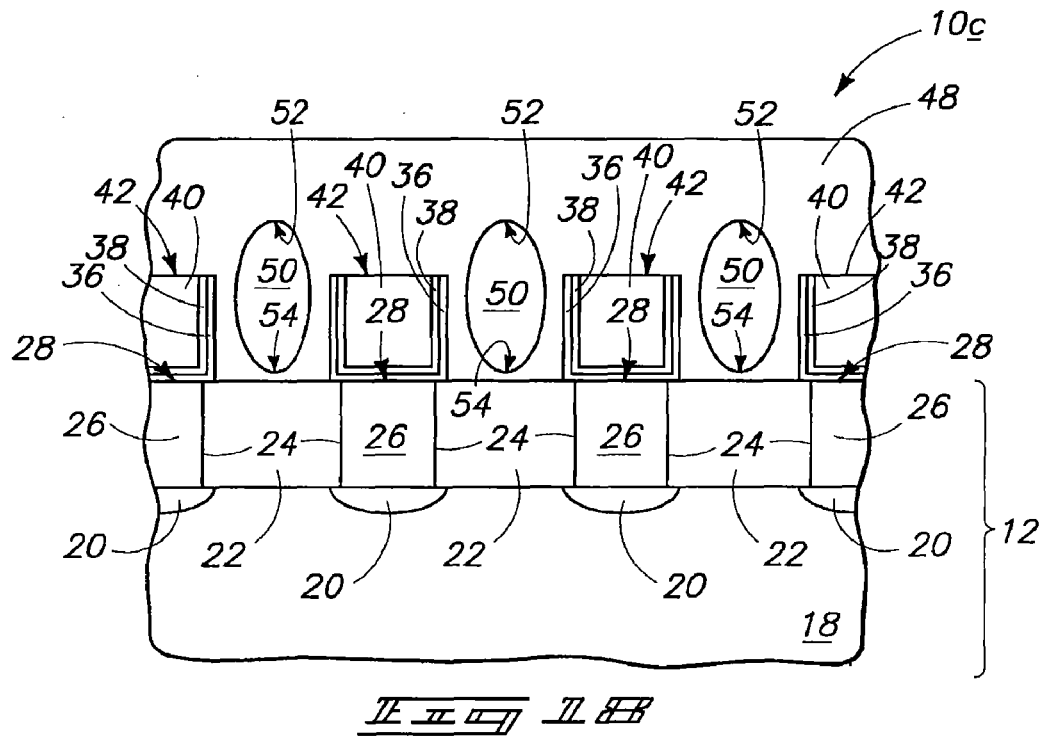
FIG. 18 is a diagrammatic sectional view of a fragment of a substrate in process in accordance with an embodiment of the invention.

For example, dielectric material 48 as deposited in FIG. 10 may be conducted without formation of voids 50 (not shown). Additionally, voids may be created independent of whether conductor layer 14 is provided. By way of example only, FIG. 18 depicts an alternate embodiment substrate fragment 10c to that depicted by FIG. 11. Like numerals from the first-described embodiment have been utilized where appropriate, with construction differences being indicated with the suffix "c" or with different numerals. Substrate fragment 10c in FIG. 18 is the same as that depicted in FIG. 11, however with conductor material 14 (not shown) having not been provided prior to depositing of damascene material 16 (not shown).

Figure 19:
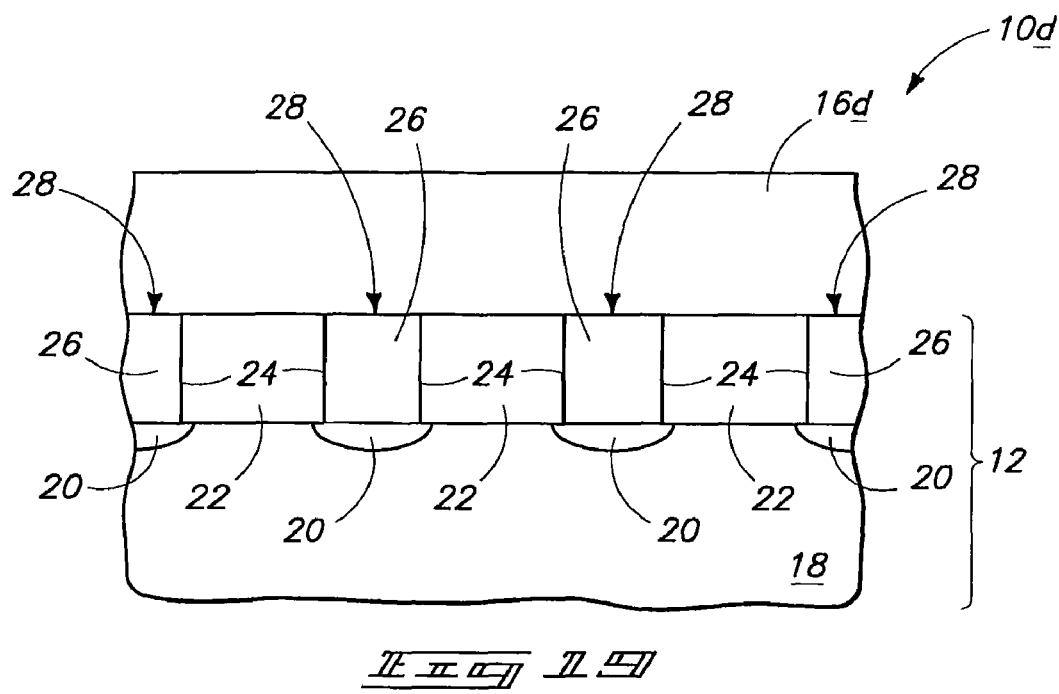
FIG. 19 is a diagrammatic sectional view of a fragment of a substrate in process in accordance with an embodiment of the invention.

Another alternate embodiment of a method of forming copper-comprising conductive lines in the fabrication of integrated circuitry is described in connection with FIGS. 19-25 with respect to a substrate fragment 10d. Like numerals from the first-described embodiment have been utilized where appropriate, with construction differences being indicated with the suffix "d" or with different numerals. FIG. 19 depicts deposition of conductive damascene material 16d over dielectric material 22 of a substrate 12. Example conductive materials include conductively doped semiconductive material such as monocrystalline silicon or polycrystalline silicon, or any conductive metal-containing material which can be selectively etched relative to copper-comprising material.

Figure 20:
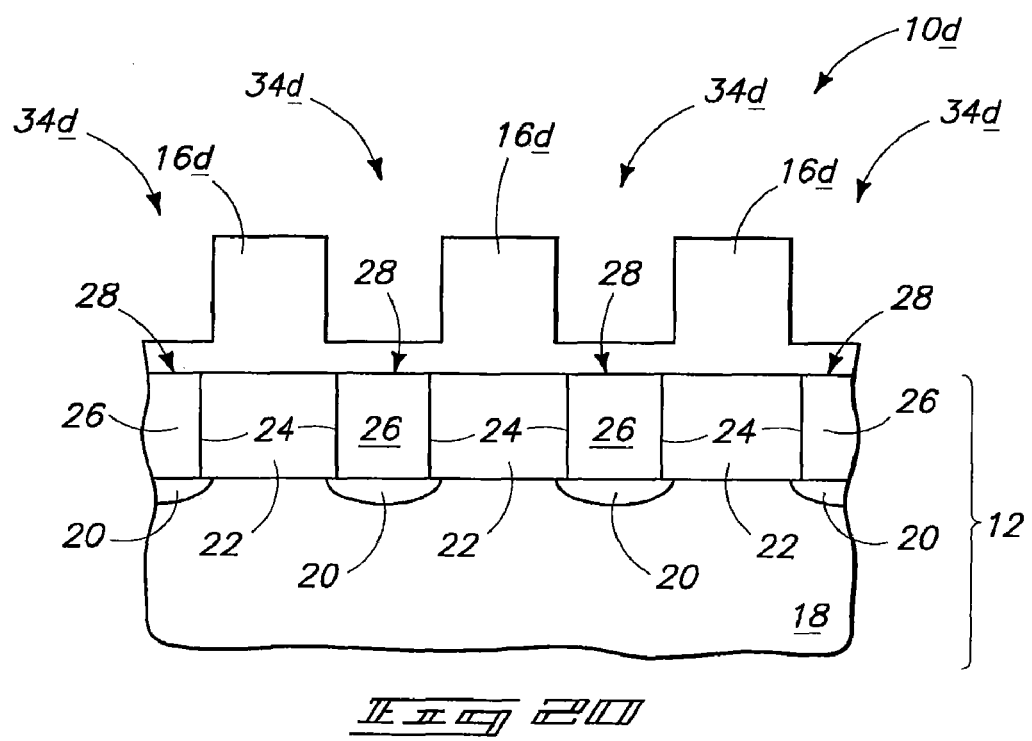
FIG. 20 is a view of the FIG. 19 substrate at a processing step subsequent to that shown by FIG. 19.

Referring to FIG. 20, line trenches 34d have been formed into conductive damascene material 16d, and which extend only partially through conductive damascene material 16d.

Figure 21:
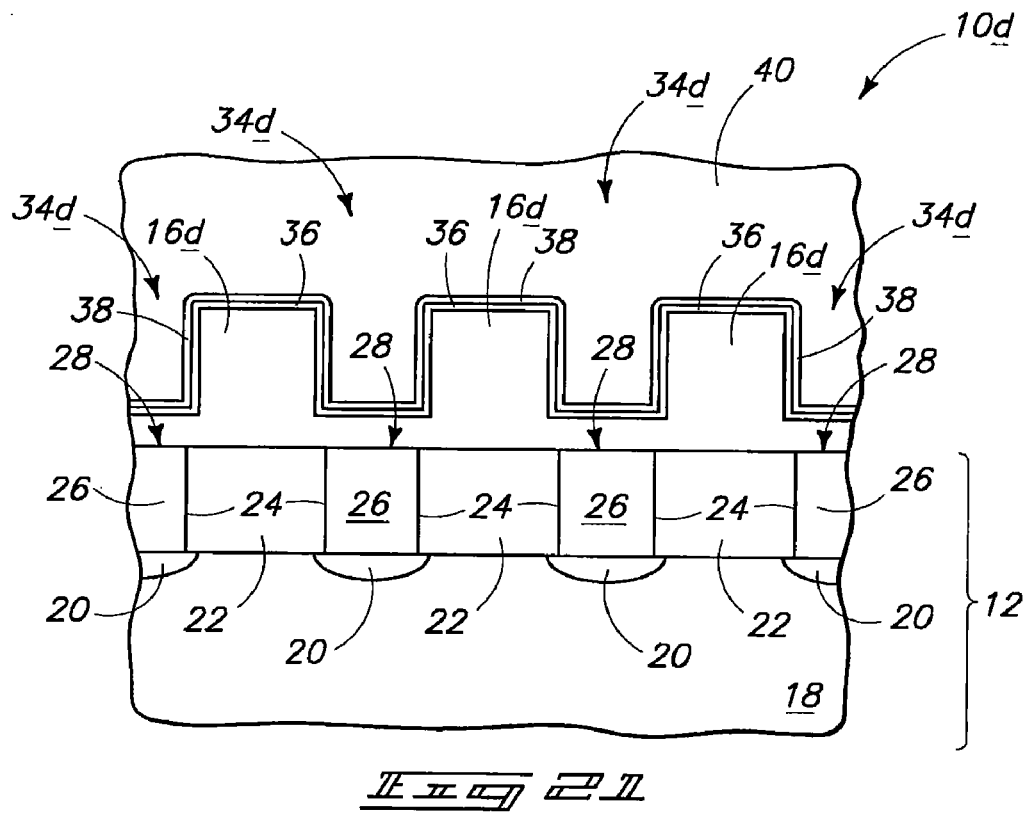
FIG. 21 is a view of the FIG. 20 substrate at a processing step subsequent to that shown by FIG. 20.

Referring to FIG. 21, conductive barrier material 36 and conductive seed material 38 have been provided over conductive damascene material 16d and within line trenches 34d. Conductive copper-comprising material 40 has been electrochemically deposited over conductive damascene material 16d and to within line trenches 34d. One or both of materials 36, 38 may or may not be used.

Figure 22:
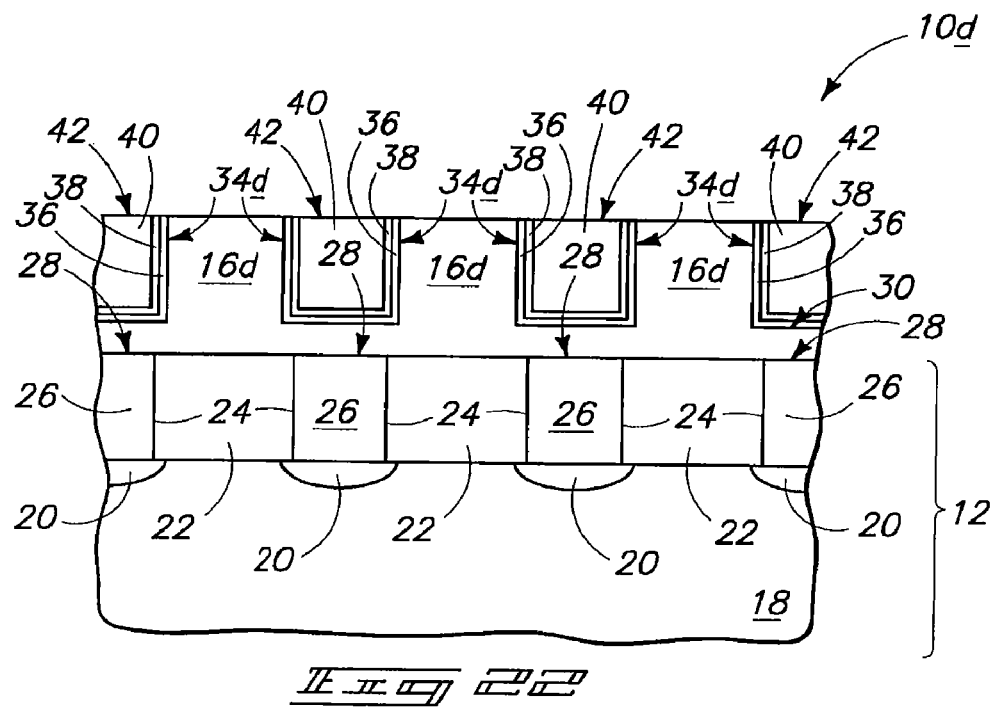
FIG. 22 is a view of the FIG. 21 substrate at a processing step subsequent to that shown by FIG. 21.

Regardless and referring to FIG. 22, conductive copper-comprising material 40 has been removed and conductive damascene material 16d has been exposed. Individual copper-comprising conductive lines 42 have been formed within individual of line trenches 34d. Conductive damascene material 16d extends laterally between and electrically interconnects/shorts adjacent of individual copper-comprising conductive lines 42.

Referring to FIG. 23, conductive damascene material 16d has been selectively removed relative to conductive copper-comprising material 40, and as shown selectively relative to conductive barrier material 36 and seed material 38. Accordingly and as shown, such act of removing removes conductive damascene material 16d from extending laterally between and electrically interconnecting adjacent of individual copper-comprising conductive lines 42. Suitable etching chemistry and conditions may be selected by the artisan to etch material 14 selectively relative to materials 36, 38, and 40 depending upon composition of all such materials. Conductive damascene material 16d remains elevationally between individual copper-comprising conductive lines 42 and substrate 12. Such by way of example only depicts an embodiment wherein the act of removing of the damascene material is conducted to remove only some of such deposited damascene material as opposed to all of it. Such also depicts but one example embodiment wherein the line trenches which are formed within the damascene material extend only partially there-through.

FIGS. 24 and 25 depict subsequent processing corresponding in sequence to that of FIGS. 10 and 11, respectively, of the first-described embodiment. Other attributes as described above may additionally or alternately be used.

FIG. 26 depicts an alternate embodiment substrate fragment to that of FIG. 1 as may be used in a method of forming copper-comprising conductive lines in the fabrication of integrated circuitry. Like numerals from the first-described embodiment have been used where appropriate, with construction differences being indicated with the suffix "e". Substrate fragment 10e is an alternate to that depicted by FIG. 1 wherein example conductive vias 28e of substrate 12 have been fabricated to comprise upwardly open voids/keyhole 75 therein. Referring to FIG. 27, conductor material 14e has been deposited effective to completely fill upwardly open voids 75. Accordingly in one example embodiment where one or more voids 75 might be formed, conductor material 14e may facilitate complete filling of such voids wherein conductive barrier material and/or conductive seed material deposited thereover prior to electrochemical deposition may not for reason such as insufficient thickness.

Damascene material 16 is deposited over conductor material 14e. Processing may otherwise continue as described above in connection with FIGS. 4-11.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming copper-comprising conductive lines in the fabrication of integrated circuitry, comprising:
   depositing damascene material over a substrate;
   forming line trenches into the damascene material;
   electrochemically depositing conductive copper-comprising material over the damascene material and to within the line trenches;
   removing conductive copper-comprising material and exposing the damascene material and forming individual copper-comprising conductive lines within individual of the line trenches;
   after exposing the damascene material, removing the damascene material selectively relative to the conductive copper-comprising material; and
   after removing the damascene material, depositing dielectric material laterally between adjacent of the individual copper-comprising conductive lines, the deposited dielectric material being received against sidewalls of the individual copper-comprising conductive lines and having a void which is received laterally between immediately adjacent of the individual copper-comprising conductive lines within the deposited dielectric material.

2. The method of claim 1 wherein there is only a single void in the deposited dielectric material received laterally between immediately adjacent of the individual copper-comprising conductive lines.

3. The method of claim 1 comprising forming the void after the depositing of the dielectric material.

4. The method of claim 1 comprising forming the void to be equally spaced laterally between immediately adjacent of the individual copper-comprising conductive lines.

5. The method of claim 1 comprising forming the void to have an uppermost terminus which is received elevationally outward of respective uppermost surfaces of the conductive copper-comprising material of immediately adjacent of the individual copper-comprising conductive lines.

6. The method of claim 1 comprising forming the void to have an innermost terminus which is received elevationally inward of respective innermost surfaces of the conductive copper-comprising material of immediately adjacent of the individual copper-comprising conductive lines.

7. The method of claim 1 comprising lining opposing sidewalls and a base of said respective trenches with conductive barrier material prior to said electrochemically depositing.

8. The method of claim 1 comprising providing conductor material elevationally between the damascene material and the substrate.

9. The method of claim 8 comprising lining opposing sidewalls and a base of said respective trenches with conductive barrier material prior to said electrochemically depositing, the conductive barrier material being in electrical contact with the conductor material.

10. The method of claim 8 wherein the conductor material has a planar outermost surface entirely across the substrate.

11. The method of claim 1 wherein the damascene material is electrically conductive.

12. The method of claim 1 wherein the damascene material is electrically insulative.

13. The method of claim 1 wherein the damascene material is semiconductive.

14. The method of claim 1 comprising forming the line trenches to extend through the damascene material.

15. The method of claim 1 comprising forming the line trenches to extend only partially through the damascene material.

16. The method of claim 1 wherein the removing of the damascene material is conducted to remove all of said deposited damascene material from the substrate.

17. The method of claim 1 wherein the removing of the damascene material is conducted to remove only some of said deposited damascene material from the substrate.

18. The method of claim 1 wherein the individual copper-comprising conductive lines overlie and are in electrical connection with respective conductive vias.

19. The method of claim 1 wherein said deposited dielectric material is homogenous.

20. The method of claim 1 wherein said deposited dielectric material is not homogenous.

21. The method of claim 1 comprising selectively depositing conductive barrier material over the individual copper-comprising conductive lines prior to the depositing of the dielectric material, the conductive barrier material not bridging between adjacent of the individual copper-comprising conductive lines.

22. A method of forming copper-comprising conductive lines in the fabrication of integrated circuitry, comprising:
depositing conductor material over dielectric material of a substrate;
depositing damascene material over the conductor material, the damascene material being at least one of insulative or semiconductive;
forming line trenches into the damascene material;
over the damascene material and to within the line trenches;
removing conductive copper-comprising material and exposing the damascene material and forming individual copper-comprising conductive lines within individual of the line trenches, the conductor material extending laterally between and electrically interconnecting adjacent of the individual copper-comprising conductive lines;
after exposing the damascene material, removing the damascene material selectively relative to the conductive copper-comprising material and the conductor material;
after removing the damascene material, removing the conductor material from extending laterally between and electrically interconnecting adjacent of the individual copper-comprising conductive lines, the conductor material remaining elevationally between the individual copper-comprising conductive lines and the substrate; and
after removing the conductor material, depositing dielectric material laterally between adjacent of the individual copper-comprising conductive lines.

23. The method of claim 22 wherein the conductor material has a planar outermost surface entirely across the substrate and over which the damascene material is deposited.

24. The method of claim 22 wherein the damascene material is insulative.

25. The method of claim 22 wherein the damascene material is semiconductive.

26. The method of claim 22 wherein the deposited dielectric material is received against sidewalls of the individual copper-comprising conductive lines and has a void which is received laterally between immediately adjacent of the individual copper-comprising conductive lines within the deposited dielectric material.

27. The method of claim 26 wherein there is only a single void in the deposited dielectric material received laterally between immediately adjacent of the individual copper-comprising conductive lines.

28. The method of claim 26 comprising forming the void to have an uppermost terminus which is received elevationally outward of respective uppermost surfaces of the conductive copper-comprising material of immediately adjacent of the individual copper-comprising conductive lines.

29. The method of claim 26 comprising forming the void to have an innermost terminus which is received elevationally inward of respective innermost surfaces of the conductive copper-comprising material of immediately adjacent of the individual copper-comprising conductive lines.

30. The method of claim 22 wherein, the individual copper-comprising conductive lines overlie and are in electrical connection with respective conductive vias, at least some of the respective conductive vias being formed with an upwardly open void therein, the depositing of the conductor material completely filling the upwardly open voids; and
at least one of a conductive barrier material and a conductive seed material is deposited over the conductor material prior to the electrochemically depositing.

31. A method of forming copper-comprising conductive lines in the fabrication of integrated circuitry, comprising:
depositing conductive damascene material over dielectric material of a substrate;
forming line trenches into the conductive damascene material which extend only partially through the conductive damascene material;
electrochemically depositing conductive copper-comprising material over the conductive damascene material and to within the line trenches;

removing conductive copper-comprising material and exposing the conductive damascene material and forming individual copper-comprising conductive lines within individual of the line trenches;

after exposing the conductive damascene material, removing the conductive damascene material selectively relative to the conductive copper-comprising material the conductive damascene material remaining elevationally between the individual copper-comprising conductive lines and the substrate; and after removing the conductive damascene material, depositing dielectric material laterally between adjacent of the individual copper-comprising conductive lines.

32. The method of claim 31 wherein the deposited dielectric material is received against sidewalls of the individual copper-comprising conductive lines and has a void which is received laterally between immediately adjacent of the individual copper-comprising conductive lines within the deposited dielectric material.

33. The method of claim 32 wherein there is only a single void in the deposited dielectric material is received laterally between immediately adjacent of the individual copper-comprising conductive lines.

34. A method of forming copper-comprising conductive lines in the fabrication of integrated circuitry, comprising:
   depositing damascene material over dielectric material of a substrate, the damascene material being at least one of insulative or semiconductive;
   forming line trenches into the damascene material;
   electrochemically depositing conductive copper-comprising material over the damascene material and to within the line trenches, the electrochemical depositing comprising forming parallel circuit conducting paths, one of said paths being outward of the damascene material, another of said paths being inward of the damascene material, the inward conductive path being formed within a conductor material that is under and extends between adjacent line trenches;
   removing conductive copper-comprising material and exposing the damascene material and forming individual copper-comprising conductive lines within individual of the line trenches; and
   removing the conductor material from extending between adjacent line trenches after the electrochemically depositing of conductive copper-comprising material.

35. The method of claim 34 wherein the conductor material has a planar outermost surface.

36. A method of forming copper-comprising conductive lines in the fabrication of integrated circuitry, comprising:
   depositing damascene material over dielectric material of a substrate, the damascene material being at least one of insulative or semiconductive;
   forming line trenches into the damascene material;
   electrochemically depositing conductive copper-comprising material over the damascene material and to within the line trenches, the electrochemical depositing comprising forming parallel circuit conducting paths, one of said paths being outward of the damascene material, another of said paths being inward of the damascene material;
   removing conductive copper-comprising material and exposing the damascene material and forming individual copper-comprising conductive lines within individual of the line trenches; and
   removing the damascene material from between the individual copper-comprising conductive lines after the electrochemically depositing of conductive copper-comprising material.

37. The method of claim 36 wherein the inward conductive path is formed within a conductor material, removing of the damascene material exposing the conductor material.

38. The method of claim 37 comprising etching through the exposed conductor material.

* * * * *

UNITED STATES PATENT AND TRADEMARK OFFICE
CERTIFICATE OF CORRECTION

| | | |
|---|---|---|
| PATENT NO. | : 8,084,355 B2 | Page 1 of 1 |
| APPLICATION NO. | : 12/762780 | |
| DATED | : December 27, 2011 | |
| INVENTOR(S) | : Zailong Bian | |

It is certified that error appears in the above-identified patent and that said Letters Patent is hereby corrected as shown below:

In column 9, line 66, in Claim 22, before "over the damascene" insert -- electrochemically depositing conductive copper-comprising material --.

In column 11, line 7, in Claim 31, delete "material" and insert -- material, --, therefor.

Signed and Sealed this
Twentieth Day of March, 2012

David J. Kappos
*Director of the United States Patent and Trademark Office*